United States Patent [19]

Toda

[11] Patent Number: 4,603,403

[45] Date of Patent: Jul. 29, 1986

[54] DATA OUTPUT CIRCUIT FOR DYNAMIC MEMORY DEVICE

[75] Inventor: Haruki Toda, Kawasaki, Japan

[73] Assignee: Kabushiki Kaisha Toshiba, Tokyo, Japan

[21] Appl. No.: 610,781

[22] Filed: May 16, 1984

[30] Foreign Application Priority Data

May 17, 1983 [JP] Japan .................. 58-86057
Dec. 27, 1983 [JP] Japan .................. 58-246311

[51] Int. Cl.⁴ .............................. G11C 7/00
[52] U.S. Cl. .................. 365/189; 365/190; 365/203
[58] Field of Search ........... 365/189, 190, 203, 205, 365/207, 208

[56] References Cited

U.S. PATENT DOCUMENTS 4,397,000 8/1983 Nagami .................. 365/189

OTHER PUBLICATIONS

Nakano et al., "A Sub 100ns 256Kb Dram," IEEE International Solid-State Circuits Conference, pp. 224-225, Feb. 25, 1983.

Moench, et al., "A Sub 100ns 256K DRAM," IEEE International Solid-State Circuits Conference, pp. 230-231, Feb. 25, 1983.

*Primary Examiner*—Joseph A. Popek
*Attorney, Agent, or Firm*—Finnegan, Henderson, Farabow, Garrett & Dunner

[57] ABSTRACT

Data from a latch section for latching the contents in a plurality of memory cells are selectively applied to a data output section through paired output lines. In the data output section, immediately before the data is output, the nodes providing gate inputs to a load transistor and a drive transistor are connected to a signal for driving the output section and become at ground level. The output of the data, which is the same as that produced in the previous cycle, is continued till the start of a cycle in which the data from the latch section is output to the output line pair. At the start of a cycle in which new data is applied from the output line pair, a reset operation is performed.

3 Claims, 51 Drawing Figures

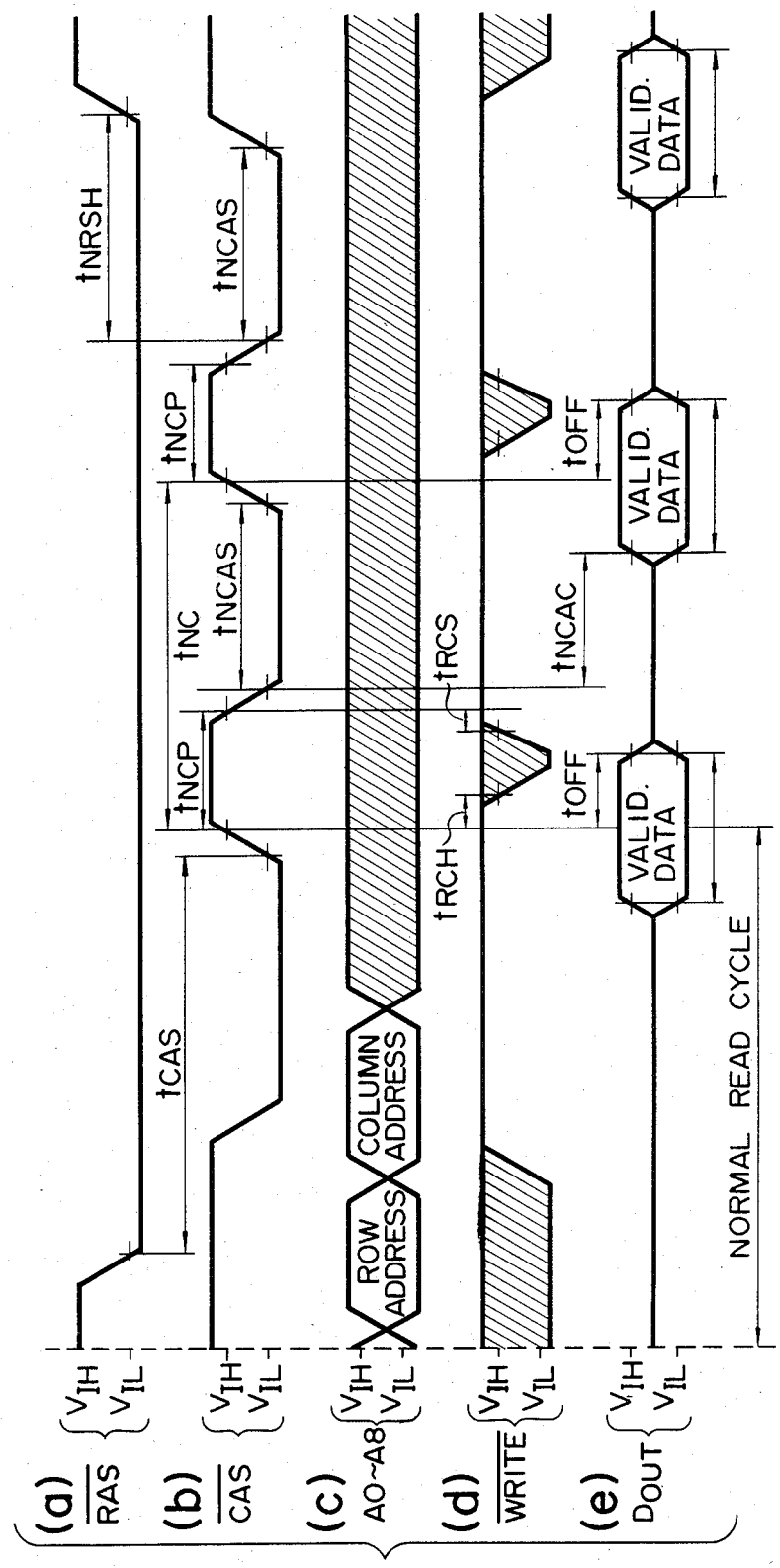
F I G. 6

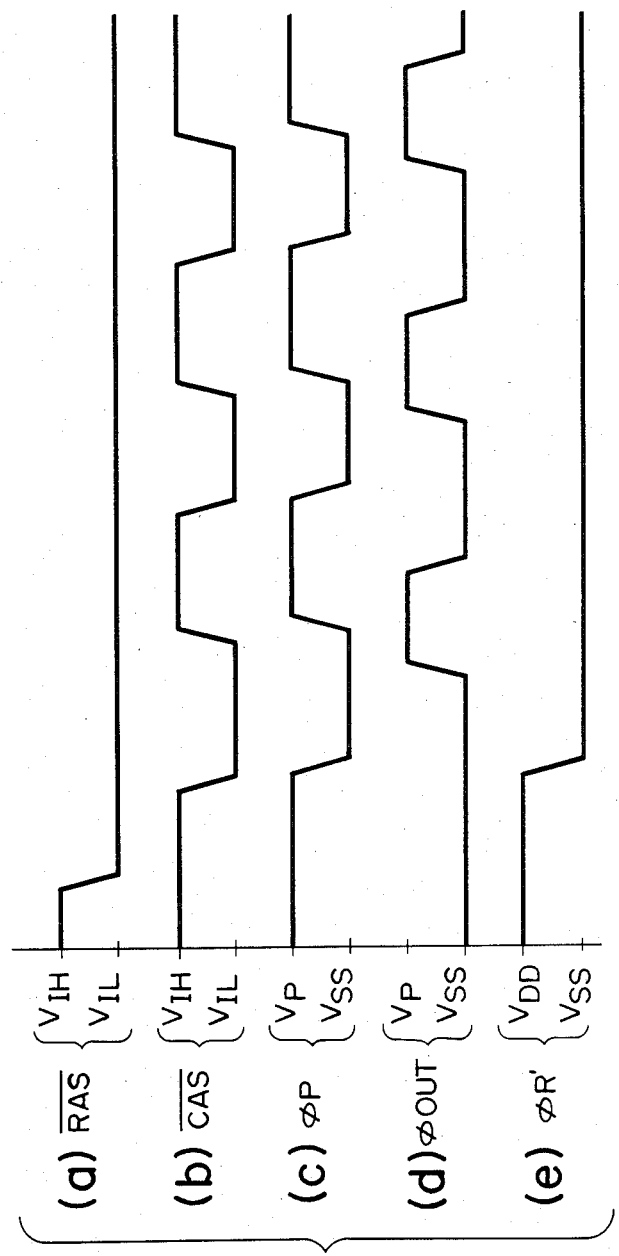

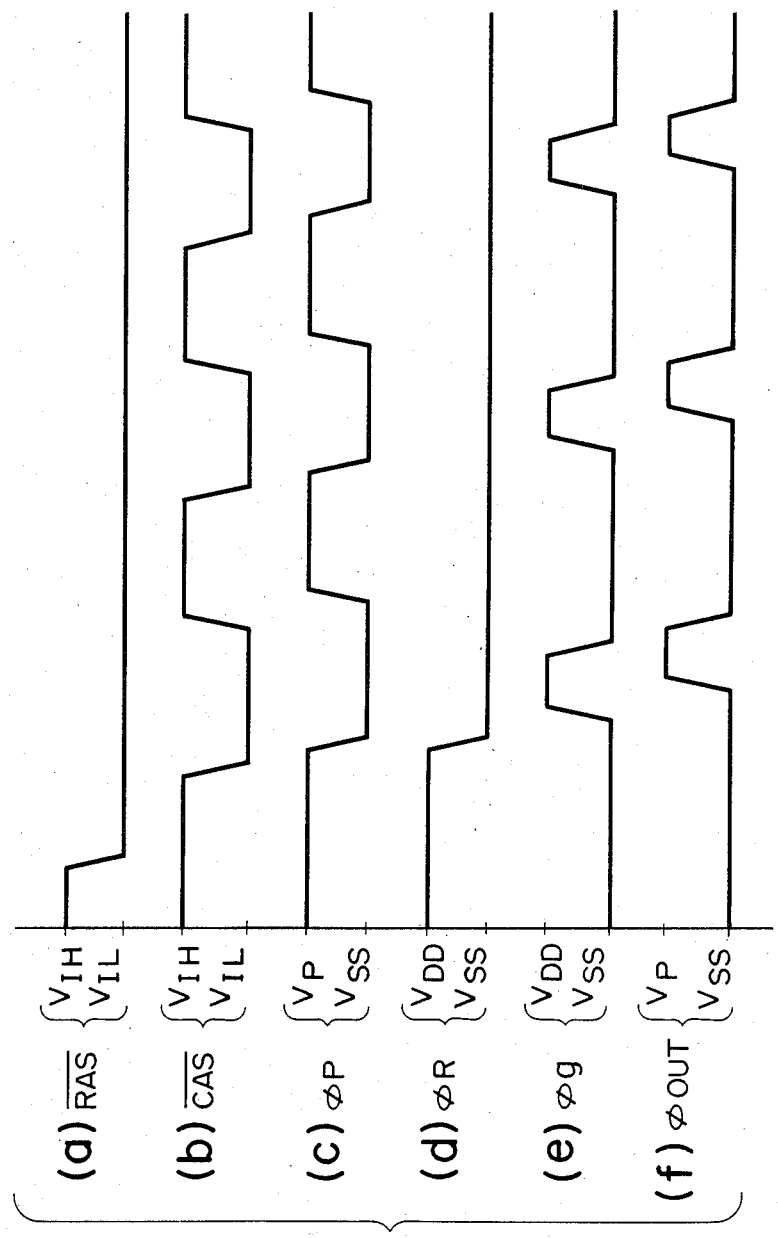

F I G. 12
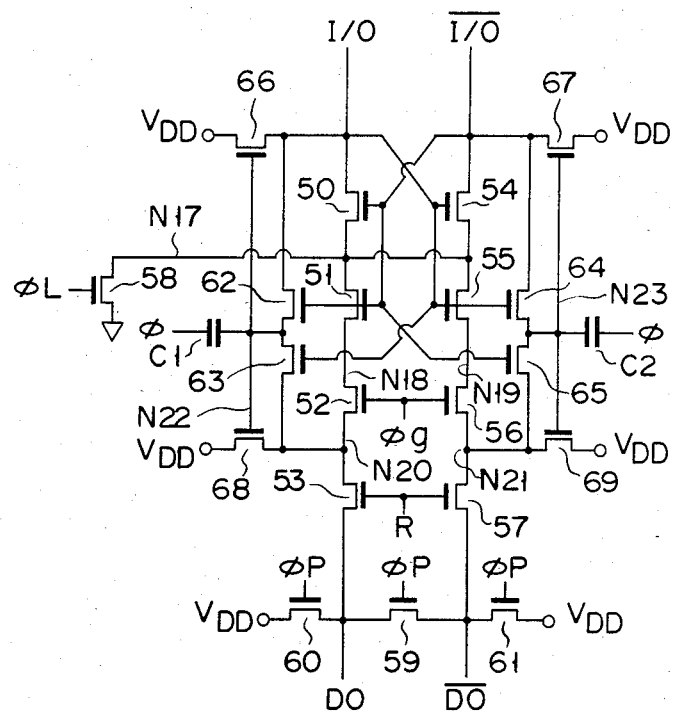

DATA OUTPUT CIRCUIT FOR DYNAMIC MEMORY DEVICE

BACKGROUND OF THE INVENTION

The present invention relates to a data output circuit for a dynamic memory device with a nibble mode function.

For large capacity semiconductor memory devices, dynamic memory devices are mainly used because the use of such memory devices requires fewer transistors for making a memory cell. Some of the dynamic memories, particularly large capacity memories, for example, 256 Kilo bits, have a nibble mode function in order to speed up the read-out and write operation. The 256 Kilo bits memory device with the nibble mode function is constructed as shown in FIG. 1, to have four memory cell groups Ca-Cd each consisting of 64 Kilo bits. The memory cells of 64 Kilo bits in each of the cell groups Ca-Cd are selectively accessed by 8-bit row addresses $A_{0R}$-$A_{7R}$ and 8-bit column addresses $A_{0C}$-$A_{7C}$.

In a read out mode of the nibble mode, a ROW ADDRESS STROBE ($\overline{RAS}$) and a COLUMN ADDRESS STROBE ($\overline{CAS}$) cooperate to specify addresses (x, y) of the memory cell groups Ca-Cd. The contents in the memory cells located at the specified addresses are read out and latched in a latch section, or a 4-bit latch Lh. Subsequently, every time the logical value of the $\overline{CAS}$ is changed, the contents of the 4-bit latch Lh are sequentially and cyclically read out through a read register Rr. The read out data is produced as output data Dout. Then, every time a logical value of the $\overline{CAS}$ is changed, and input data Din are sequentially loaded into the bit stages of the 4-bit latch Lh, through a write register Wr, the data are written into memory cells located at the specified addresses of those cell groups Ca-Cd. In FIG. 1, a program counter Pc specifies one specific bit in the 4-bit latch Lh. While receiving the most signigicant bit (MSB) $A_{8R}$ of the row address signal and the MSB $A_{8C}$ of the column address signal, the program counter Pc cyclically performs the counting operation according to a change of the logical value of the $\overline{CAS}$. By the count of the program counter Pc, one specific bit is selected from those in the 4-bit latch counter Lh. A selector Sr selects either the read out register Rr or the write register Wr according to an operation mode of the semiconductor memory device, either a read mode or a write mode.

FIG. 2 shows timing diagrams illustrating a read cycle of the semiconductor memory device. A row address is given by an address signal A0-A8, applied during an effective period to indicate that the $\overline{RAS}$ is low or L in logical level. A column address is given by an address signal A0-A8, applied during an effective period to indicate that the $\overline{CAS}$ is L. The row and column addresses are selected by these signals. Then, every time the $\overline{CAS}$ changes in logical level, the contents in the bit stages of the 4-bit latch Lk are sequentially and cyclically read out from the memory cells of the semiconductor memory device. In the read operation, the memory cell, as specified by the row address $A_{8R}$ and the column address $A_{8C}$, is first read out.

A write mode of the semiconductor memory device is executed according to timing diagrams shown in FIG. 3. A row address is given by an address signal A0-A8, as applied during an effective period, to indicate that the $\overline{RAS}$ is L. A column address is given by an address signal A0-A8, as applied during an affective period to indicate that the $\overline{CAS}$ is L. After a row address and a column address are selected by these signals, a write signal ($\overline{WRITE}$) is effected and the write operation is performed every time the signal $\overline{CAS}$ changes.

Let us consider the case when the 4-bit latch Lh contains c, d, a, and b, for example, data e-o are sequentially written into the memory cells. In this case, the data c is first replaced by data e. Subsequently, the data is replaced from d to f, a to g, b to h, e to i, f to j, g to k, b to h, i to m, j to n and k to o. The finally replaced data is written into the memory cell in each of the cell groups Ca-Cd as specified by the row address signal and the column address signal, and the data already stored is discarded. Therefore, the contents of the memory cells in the cell groups Ca-Cd, corresponding to the cells a-d in the 4-bit latch Lh, are o, l, m, and n, respectively.

As described above, in the dynamic memory device with such a nibble mode function, by changing the $\overline{CAS}$ at short periods while keeping the $\overline{RAS}$ at L, it can read out or write the contents of the 4-bit latch Lh at a high speed in synchronism with the $\overline{CAS}$, without changing the address.

FIG. 4 shows a circuit diagram illustrating an arrangement of one bit stage of the conventional 4-bit latch Lh. As shown, latch line pairs I/O and $\overline{I/O}$ are respectively connected to paired output lines DO and $\overline{DO}$ through series circuits containing MOSFETs 1-4 and 5-8. The gates of the MOSFETs 1 and 2 are wired together and to the latch line $\overline{I/O}$. Likewise, the gates of the MOSFETs 5 and 6 are wired together and to the latch line I/O. A series connection point of the MOSFETs 1 and 2 and a series connection point of the MOSFETs 5 and 6 are interconnected through a node N1. The node N1 is connected through a MOSFET 9 to a power source $V_{SS}$. A clock pulse $\phi L$ is applied to the gate of the MOSFET 9. The MOSFETs 2 and 3 are series connected to provide a node N2. The MOSFETs 6 and 7 are series connected to provide a node N3. The gates of MOSFETs 3 and 7 as a first transistor pair are wired together. A clock pulse $\phi g$ is applied to the interconnected gates of the first transistor pair. Further, the MOSFETs 3 and 4 are series connected to provide a node N4, and the MOSFETs 7 and 8 are series connected and provide a node N5. The gates of the MOSFETs 4 and 8 as a second transistor pair are connected together. A select signal R is applied to the interconnected gates of the second transistor pair. The read register Rr, succeeding the 4-bit latch register Lh thus arranged, contains a MOSFET 10, inserted between the output line pair DO and $\overline{DO}$, and MOSFETs 11 and 12, inserted between the power sources $V_{DD}$, with the MOSFET 10 interposing therebetween. A clock pulse $\phi p$ is applied to the gates of these MOSFETs 10-12.

In a write mode, a level on the latch line pair I/O and $\overline{I/O}$ is forced to be changed according to the write data. At this time, the clock $\phi g$ is placed in a L level to turn off the first transistor pair of the MOSFETs 3 and 7, in order that levels on the latch output line pair DO and $\overline{DO}$ remain unchanged.

Four latch circuits, each as shown in FIG. 4, are arranged in a parallel fashion to form the 4-bit latch Lh. Potentials on the latch output line pair DO and $\overline{DO}$ are produced through the next stage read register Rr.

With such an arrangement, the latch line pair I/O and $\overline{I/O}$ are precharged up to a potential of the power / source $V_{DD}$ when the $\overline{RAS}$ is H, as shown in a timing chart of FIG. 5. When the $\overline{CAS}$ is H, the clock $\phi p$ is Vp ($>V_{DD}+V_T$), and hence the latch output line pair DO and $\overline{DO}$ are precharged up to $V_{DD}$ by a combination of the MOSFETs 10–12. When the $\overline{CAS}$ falls, data from the memory cell is transferred to the latch line pair I/O and $\overline{I/O}$, so that the latch line pair has a logical level as given by the contents of the data transferred. In this logical state on the latch line pair I/O and $\overline{I/O}$, the clock $\phi L$ rises and the node N1 is coupled with a power source $V_{SS}$. The contents of the data cause one of the MOSFETs 1 and 5 constituting a flip-flop to turn on. At this time, the data causes one of the MOSFETs 2 and 6 to turn on. This results in simultaneous discharge from one of the latch line pair I/O and $\overline{I/O}$ and one of the nodes N2 and N3. The nodes N1–N3 are charged at a voltage $V_{DD}-V_T$ at the precharging time where the $\overline{RAS}$ is H. Here, if the latch is selected, the clock pulse $\phi g$ rises up to a potential Vp, and slightly later a select signal R also rises. Accordingly, the nodes N2 and N4 are connected to the output line DO, while the nodes N3 and N5 are connected to the output line $\overline{DO}$. Under this condition, one of the latch output lines DO and $\overline{DO}$ is discharged according to the data held by the flip-flop made up of the MOSFETs 1 and 5. At the same time, the other is in a floating state and keeps a precharge level.

Under this condition, one of the output lines DO and $\overline{DO}$ is connected to the power source $V_{SS}$ and its potential is reliably fixed at that potential. However, the other is in a floating state and if it is connected to another node, charges on this output line are shared with the node. The potential on the output line drops or is greatly changed by charge leakage or the like.

FIG. 6 shows a timing diagram exaggeratedly illustrating a read cycle in the nibble mode. As shown, valid data is output after a predetermined time $t_{NCAC}$ following the fall of the column address strobe signal $\overline{CAS}$. The valid data terminates after a predetermined time $t_{off}$ following the rise of the column address strobe signal $\overline{CAS}$. These time delays $t_{NCAC}$ and $t_{off}$ are determined by the associated circuit. A cycle time $t_{NC}$ can be set at a proper value if it is larger than a minimum value $t_{NCmin}$, which depends on minimum values $t_{NCPmin}$, of a precharge time $t_{NCP}$ and $t_{NCASmin}$, of a pulse width $t_{NCAS}$ of the column address strobe signal $\overline{CAS}$ for guaranteeing circuit operation.

In receiving data, a valid data period of the output data Dout is important, that is, a width of a data window. A memory device with a large data window is very easy to use because the design on the data transfer between the memory device and the peripheral circuit suffers from fewer design restrictions. To widen the data window, it is sufficient to enlarge the pulse width $t_{NCAS}$ of the column address strobe signal $\overline{CAS}$. This results in an elongation of the cycle time $t_{NC}$. The elongated cycle time $t_{NC}$ degrades the high speed performance as a useful feature of the nibble mode function. Ideally, it is desired that a maximum data window be gained within a minimum cycle time.

Theoretically, the period of the data window can be enlarged up to the cycle time $t_{NC}$, if desired. In this case, however, there is a limit in reducing the time period $t_{NCAC}$ ranging from the fall of the column address strobe signal $\overline{CAS}$ to the data output. Further, a reduction of the time $t_{off}$, if done, can be at most approximately the minimum value $t_{NCPmin}$ of the precharge period. Therefore, a practical maximum value of the data window is approximately $t_{NCAS}-t_{NCAC}+t_{NCPmin}$.

This indicates that when the memory device is operated with the minimum cycle time $t_{NCmin}$, the data window is approximately $t_{NCmin}-t_{NCAC}$ and is very small.

Another way to enlarge the data window is to further elongate the time $t_{off}$. The clock pulse used in the precharging system is used for resetting the data output circuit. Therefore, if the time $t_{off}$ is set at large value, the reset clock pulse must be greatly delayed behind the rise of the column address strobe signal $\overline{CAS}$. If an extremely short precharge time $t_{NCP}$ is set, the reset clock pulse fails to rise, and the read operation enters into the next read cycle. To avoid this, it is necessary increase the minimum value $t_{NCPmin}$ during the precharge period. The result is an enlargement of the minimum value $t_{NCmin}$ of the cycle time and a degradation of the high speed performance associated with the nibble mode function.

Turning now to FIG. 7, there is shown a circuit diagram of the data output section of the read register Rr. As shown, three MOSFETs 11–12, connected in series fashion, are connected at both ends to the power source $V_{DD}$. The series connection points of these MOSFETs are respectively coupled with paired output lines DO and $\overline{DO}$ of the latch circuit. The paired output lines DO and $\overline{DO}$ are respectively connected through the MOSFETs 13 and 14 to the power source $V_{SS}$. Further, those output lines are respectively connected to the gates of the MOSFETs 17 and 18, through the MOSFETs 15 and 16 and nodes N6 and N7. A precharge clock $\phi p$ is applied to the MOSFETs 10–12. The gates of the MOSFETs 15 and 16 are connected together to the power source $V_{DD}$. Drive signals $\phi out$ are respectively connected to the power supply $V_{SS}$ through the series paths of the MOSFETs 17 and 19 and of the MOSFETs 18 and 20. The gate of the MOSFET 13 is connected to the power source $V_{SS}$ through the node N8 and the MOSFET 21. A precharge clock $\phi p$ is applied to the gate of the MOSFET 21. The gate of the MOSFET 13 is connected to the gates of the MOSFETs 20 and 22 and to a series connection point of the MOSFETs 17 and 19. The gate of the MOSFET 14 is connected to the power source $V_{SS}$ through the MOSFET 23, of which the gate is impressed with a precharge clock pulse $\phi p$. The gate of the MOSFET 14 is connected to the gates of the MOSFETs 19 and 24 and a series connection point of the MOSFETs 18 and 20. The MOSFETs 24 and 22 as respectively the load transistor and the drive transistor are connected in series between the power sources $V_{DD}$ and $V_{SS}$. Output data is derived from a data output node Output, or a series connection point of these transistors 24 and 22.

The read register Rr with such a circuit arrangement operates in a sequence as shown in FIG. 8 As shown, at the precharge time or when the column address strobe signal $\overline{CAS}$ is H, the precharge clock $\phi p$ is Vp ($>V_{DD}+V_T$), and the paired output lines DO and $\overline{DO}$ in the latch circuit are at $V_{DD}$ level. A potential at the node N6 between the MOSFETs 15 and 17 is $V_{DD}-V_T$. A potential at the node N7 between the MOSFETs 16 and 18 is also $V_{DD}-V_T$. Also at this time, the node N8, associated with the gate of the MOSFET 22, and the node N9, associated with the MOSFET 24, are at potential of $V_{SS}$. Under this condition, the MOSFETs 22 and 24 are turned off and the output node Output of the read register is at a high impedance.

When the column address strobe signal $\overline{CAS}$ is L, the precharge clock signal $\phi p$ is also L. At this time, if data is applied to the register Rr through the output line pair DO and $\overline{DO}$, the nodes N6 and N7 are placed at the potential according to the applied data. When the output clock $\phi$out rises up to Vp, the nodes N8 and N9 are at Vp level according to the data. Potentials at the nodes N8 and N9 are fed back to the output line pair DO and $\overline{DO}$, through the MOSFETs 13 and 14, thereby ensuring the data transfer. According to the potentials on the nodes N8 and N9, one of the MOSFETs 22 and 24 is turned on and the output node Output is at $V_{DD}$ or $V_{SS}$. When the column address strobe signal $\overline{CAS}$ rises, the precharge clock $\phi$p rises too. The nodes N8 and N9 are both at $V_{SS}$, and the output node Output is at a high impedance. In this case, to make the time $t_{off}$ long, it is sufficient to delay the rise of the precharge clock $\phi$p. When the rise of the precharge clock $\phi$p is delayed too much, it can not rise within the precharge cycle of the column address strobe signal $\overline{CAS}$, as indicated by $\phi R'$ in FIG. 8. Further, the output line pair DO and $\overline{DO}$ of the latch circuit are not precharged. As a result, it is impossible to transfer data in the succeeding fall cycle of the column address strobe signal $\overline{CAS}$. Therefore, the delay of the time $t_{off}$ is limited within the time period allowing the precharge clock $\phi$p to rise. This implies that the elongation of the time $t_{off}$ must be approximately within the minimum value $t_{NCPmin}$ of the precharge time period. For this reason, an insufficient width of the data window can be obtained.

SUMMARY OF THE INVENTION

Accordingly, an object of the present invention is to provide a data output circuit for a dynamic memory device having a data output section capable of widening a data window period up to approximately a minimum cycle $t_{NCmin}$, and a latch section for reliably fixing potentials on paired output lines of a latch circuit by respectively coupling the paired output lines to the power sources $V_{ss}$ and $V_{DD}$ at the time of data outputting.

According to the present invention, there is provided a data output circuit for a dynamic memory device which can reliably keep the potentials on the paired output lines of a latch circuit, and which has a wide data window; hence, facilitating the interface of the memory device with a peripheral circuit. It is thereby capable of making the best use of the high speed performance essential to the nibble mode.

BRIEF DESCRIPTION OF THE DRAWINGS

FIGS. 6(a)–(e) is an exaggerated timing diagram illustrating a read cycle of the nibble mode;

FIGS. 8(a)–(e) is a timing diagram illustrating a sequence of operations of the data output section shown in FIG. 7;

FIGS. 10(a)–(f) is a timing diagram illustrating a sequence of the operations of the data output section shown in FIG. 9;

FIG. 12 is a circuit diagram illustrating a latch section, which is another embodiment of the present invention.

DETAILED DESCRIPTION OF THE PREFERRED EMBODIMENTS

A data output section for a dynamic memory device, which is an embodiment of the present invention, will be described referring to FIG. 9. As shown, MOSFETs 35 and 36 are respectively inserted between series connection points of MOSFETs 30-32 and MOSFETs 33 and 34. A gate clock pulse $\phi$g is applied to the gates of the MOSFETs 35 and 36. The MOSFETs 33 and 34 are connected together at a node N10 and a MOSFET 37 which is further connected to ground. An output clock $\phi$out is applied to the gate of the MOSFET 37. A gate clock pulse $\phi$g is applied through a MOSFET 38 to a node N11 between the MOSFETs 35 and 33. A precharge clock $\phi$p is applied to the gate of the MOSFET 38. A gate clock pulse $\phi$g is applied through a MOSFET 39 to a node N12 as a series connection point of the MOSFETs 34 and 36. A precharge clock $\phi$p is applied to the gate of the MOSFET 39. A node N13 is continuous to a MOSFET 40 which is coupled at one end to an output clock $\phi$out. A node N41 is continuous to a MOSFET 41 which is coupled at one end to an output clock $\phi$out. The gate of the MOSFET 40 is connected to a node N11 through a node N15 and a MOSFET 42. The gate of the MOSFET 41 is connected to the node N12 through a node N16 and a MOSFET 43. The gates of the MOSFETs are connected together to the power source $V_{DD}$. The node N13 is connected to the power source $V_{SS}$ through MOSFETs 44 and 45. A reset clock pulse $\phi_R$ is applied to the gate of the MOSFET 44. The gate of the MOSFET 45 is connected to the node N14. The node N14 is connected to the power source $V_{SS}$ through the MOSFETs 46 and 47. A reset clock pulse $\phi_R$ is applied to the gate of the MOSFET 46. The gate of the MOSFET 47 is connected to the node N13. Further, MOSFETs 48 and 49 respectively as load and drive transistors are connected in series between the power source $V_{DD}$ and $V_{SS}$. An output signal Output is derived from a series connection point of these transistors 48 and 49.

With such an arrangement, when the row address strobe signal $\overline{RAS}$ has risen and the column address strobe signal $\overline{CAS}$ is at $V_{IH}$, that is, in a precharge phase, the precharge clock $\phi$p is at $V_{DD}+V_T$, where $V_{DD}$ is the power voltage and $V_T$ is a threshold voltage of the MOSFET. The reset clock pulse $\phi_R$ is at $V_{DD}$.

Figure 9:
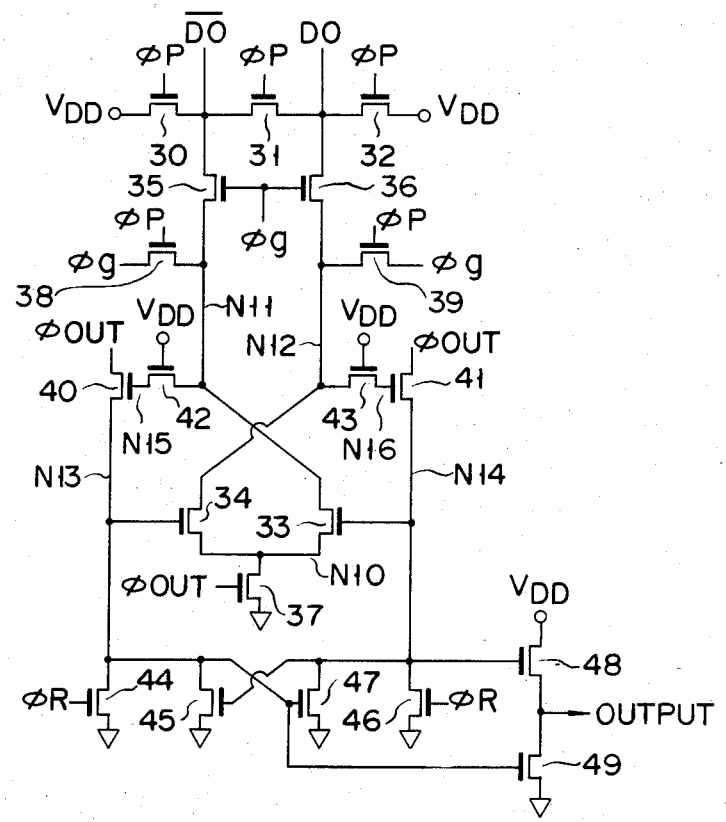
FIG. 9 shows a circuit diagram illustrating an embodiment of a data output circuit for a dynamic memory device according to the present invention.

Accordingly, in the circuit diagram of FIG. 9, the latch output line pair DO and $\overline{DO}$ are charged to the potential of the power source $V_{DD}$ since the MOSFETs 30-32 are in an ON state. The node N11-16, except the output line pair DO and $\overline{DO}$ and the node N10, are at the potential of the power source $V_{SS}$ because the MOSFETs, of which the gates are applied with either the precharge clock $\phi_p$ or the reset clock pulse $\phi_R$, is turned on and the clock pluses $\phi_g$ and $\phi_{out}$ are at $V_{SS}$. Further, the node N10 is in a floating state. Therefore, the output signal Output is disconnected from both the power sources $V_{DD}$ and $V_{SS}$.

When the column address strobe signal $\overline{CAS}$ falls, the gate clock pulse $\phi_g$ rises up to the potential of the power source $V_{DD}$, while the precharge clock $\phi_p$ and the reset clock pulse $\phi_R$ both fall. Then, the MOSFETs 35 and 36 are turned on, while the MOSFETs 30–32, 38, and 39 are turned off. The charges stored in the output line DO of the latch circuit are distributed into the nodes N12 and N16. The charges stored in the $\overline{DO}$ are distributed into the nodes N11 and N15. Then, the paired output lines DO and $\overline{DO}$ and the nodes N11, N12, N15, and N16 are at a medium potential $V_M$. The capacitance of the paired output line DO or $\overline{DO}$ is generally larger than that at the nodes N12 and N16 or N11 and N15. Therefore, the medium potential $V_M$ is higher than the threshold voltage of the MOSFETs 40 and 41, and hence turns on these transistors. When the capacitance of the output line DO or $\overline{DO}$ is smaller than the capacitance of the nodes N12 and N16 or N11 and N15, it is necessary to additionally use a proper capacitor for the output line DO or $\overline{DO}$. Further, the nodes N13 and N14 are coupled with an output circuit drive signal $\phi_{out}$ which is at the potential of the power source $V_{SS}$, and keeps the potential $V_{SS}$ as given in the precharge phase. Therefore, the output signal Output is disconnected from both the power sources $V_{SS}$ and $V_{DD}$.

Let us assume now that with the output signal from the latch section, the output line DO is coupled with the power source $V_{DD}$ and the output line $\overline{DO}$ with the power source $V_{SS}$. In this case, the potential at the nodes N16 and N12 is $V_{DD}-V_T$, and the potential at the nodes N15 and N11 is $V_{SS}-V_T$. When the drive signal $\phi_{out}$ rises to the potential Vp, the node N16 is coupled with the drive signal $\phi_{out}$ and rises to the potential of Vp because of the presence of the barrier MOSFET 43. The node N14 is also at the potential Vp of the drive signal $\phi_{out}$. At this time, the MOSFET 37 is turned on, and hence the MOSFET 33 is turned on. The result is that the output line $\overline{DO}$, and the nodes N15 and N11 are connected to the potential $V_{SS}$. The gate of the MOSFET 48 is at Vp level to allow the output signal Output to be connected to the potential of the power source $V_{DD}$. In this way, the data on the output line DO is output from the output node Output.

When the column address strobe signal $\overline{CAS}$ rises, the gate clock pluse $\phi_g$ falls to the potential of the power source $V_{SS}$, and the precharge clock $\phi_p$ rises up to the potential Vp. Accordingly, the MOSFETs 38 and 39 are turned on, and the nodes N16 and N12, and N15 and N11 are at the $V_{SS}$ level. And the MOSFETs 40 and 41 are turned off. Accordingly, if the drive signal $\phi_{out}$ then falls to the potential $V_{SS}$, the nodes N13 and N14 keep the previous potential levels. Therefore, the potential Vp at the node N14 is kept at its level. Also at this time, the MOSFETs 30–32 are turned on, and the output line pair DO and $\overline{DO}$ are precharged at level $V_{DD}$. It is assumed that the precharge time $t_{NCP}$ is the minimum cycle approximate to the minimum value $t_{NCPmin}$, which is within the tolerable range in the design of this circuit. The column address strobe signal $\overline{CAS}$ falls before the reset clock pulse $\phi_R$ rises. Eventually, the reset clock pulse $\phi_R$ fails to rise, and the MOSFETs 44 and 46 are left in an OFF state. Thus, this circuit is designed such that the reset clock pulse $\phi_R$ is delayed on its rise to elongate the time $t_{off}$ and to widen the data window.

Accordingly, even if the column address strobe signal $\overline{CAS}$ falls, the node N14 is left at Vp, the MOSFET 48 is in an ON state, and the output node Output continues the output of data. When the column address strobe signal $\overline{CAS}$ in the next cycle falls while the data is being output, the gate clock pulse $\phi_g$ rises to the potential of the power source $V_{DD}$, but the precharge clock $\phi_p$ falls to the potential of the power source $V_{SS}$. The result is that the MOSFETs 35 and 36 are turned on, the output line pair DO and $\overline{DO}$ and the nodes N16, N12, N15, and N11 are all at the same medium potential level $V_M$. Then, the MOSFETs 40 and 41 are turned on and the output drive circuit signal $\phi_{out}$ at the potential $V_{SS}$ is coupled with the nodes N13 and N14, thereby to change the potential on the node N14 from the Vp to $V_{SS}$.

The above sequence of the operations is correspondingly applied for the case that the node N13 is at Vp. At this time, the output node Output is isolated from the power sources $V_{DD}$ and $V_{SS}$. The data output operation in the previous operation cycle stops. With the output of the latch section, one of the output line DO and $\overline{DO}$ is connected to the power source $V_{DD}$, while the other is connected to the power source $V_{SS}$. Then, the output circuit drive signal $\phi_{out}$ rises up to Vp. A subsequent operation of this circuit under discussion is similar to that of the above data output.

In the final cycle of the nibble mode operation, when the column address strobe signal $\overline{CAS}$ rises, the reset clock pulse $\phi_R$ rises to the potential of the power source $V_{DD}$ since the precharge time is sufficiently large. Then, the MOSFETs 44 and 46 are turned on and the nodes N13 and N14 are connected to the power source $V_{SS}$, thereby to turn on the MOSFETs 48 and 49. Then, the output node Output is disconnected from both the power sources $V_{DD}$ and $V_{SS}$ and the data output is stopped.

There is a possibility that the precharge clock pulse $\phi_p$ and the gate clock pulse $\phi_g$ are so timed as to have a period in which both are H. During this period, the charges in the output line pair DO and $\overline{DO}$ are discharged. To prevent the discharge from the output line pair DO and $\overline{DO}$, the particular circuit under discussion applies the gate clock pulse $\phi_g$ through the MOSFETs 38 and 39 to the nodes N11 and N12. Therefore, when the precharge clock $\phi_p$ and the gate clock pulse $\phi_g$ are not simultaneously "H", the nodes of the MOSFETs 38 and 39, to which the gate clock pulse $\phi_g$ is applied, may be connected to the power source $V_{SS}$. It is evident that a clock pulse, changing like the gate clock pulse $\phi_g$, may be used for the gate clock pulse $\phi_g$. The signal $\phi_{out}$ input to the gate of the MOSFET 37 may also be replaced by a signal which is pulsed from low to high before the signal $\phi_{out}$ rises and pulsed from a high to a low of the $V_{SS}$ before the gate clock pulse $\phi_g$ rises.

With such an arrangement, the nibble mode operation is performed in the following manner with the minimum cycle $t_{NCmin}$ and the precharge time $t_{NCPmin}$, when the column address strobe signal $\overline{CAS}$ rises following the row address strobe signal $\overline{RAS}$, as shown in a timing diagram of FIG. 11.

Figure 11:
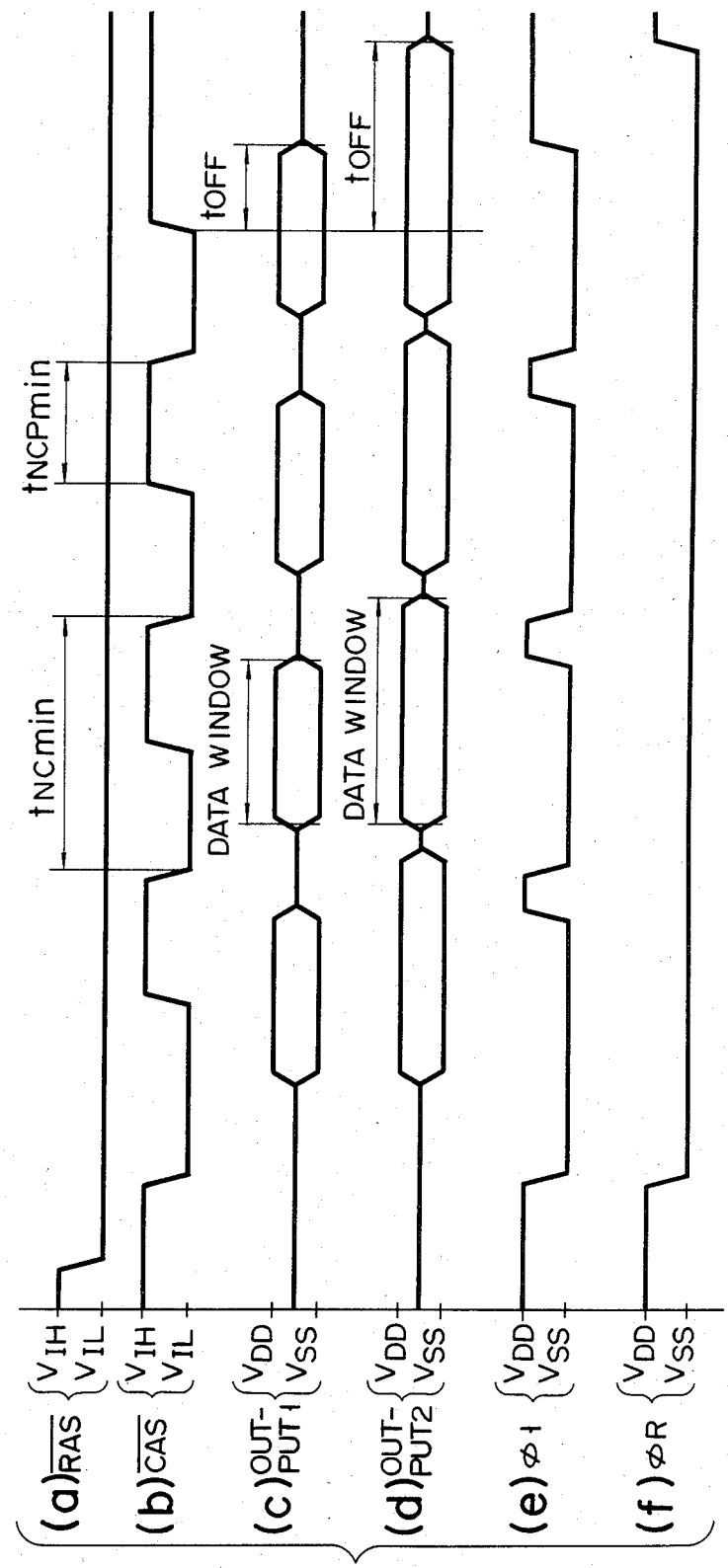
FIG. 11 is a timing diagram for comparatively illustrating the operations of the data output sections of FIGS. 7 and 9.

In FIG. 11, an Output 1 indicates a waveform of the output signal from the conventional data output section for a dynamic memory device. The data output section is reset by the clock signal $\phi_1$ in the precharge system which rises following the sequence of operations associated with the precharge on an internal node, which follows the rise of the column address strobe signal $\overline{CAS}$. Therefore, the data output section is not reset until the clock $\phi 1$ rises. In other words, the data output section can not produce the data before the signal $\phi 1$ rises. As a result, thd dat window is much shorter than the minimum cycle $t_{NCmin}$.

An output 2 in FIG. 11 illustrates a waveform of the output signal from the data output section, as shown in FIG. 9. A reset clock pulse $\phi_R$ is used in the precharge system for resetting this circuit. In order to obtain a long enough time period $t_{off}$, the reset clock pulse $\phi_R$ rises, after a long delay, behind the rise of the column address strobe signal $\overline{CAS}$. Because of this, it can not rise within the cycle of the minimum nibble mode. Nevertheless, the data output section normally operates since it is reset by making use of the charged stored at the time of precharge to the output line pair DO and $\overline{DO}$. Further, the data window is extended to approach the minimum cycle $t_{NCmin}$. Therefore, the data output circuit of FIG. 9 can make the best use of the high speed performance essential to the nibble mode, while requiring less design restrictions on the signal timings in the circuit operation.

Figure 1:
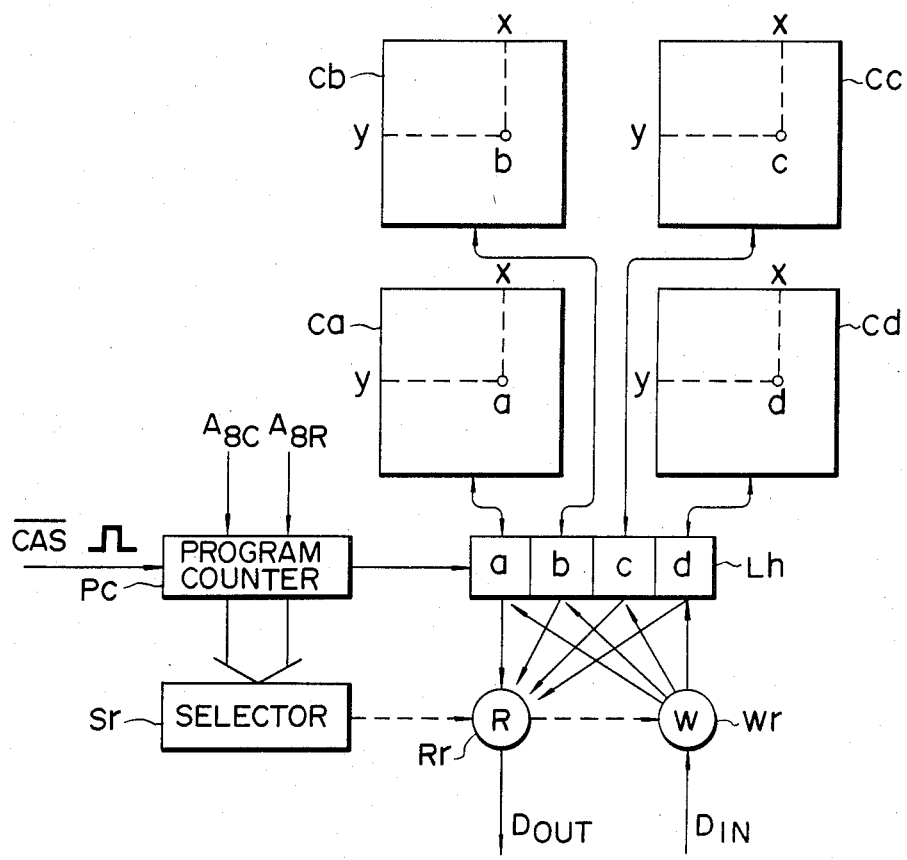
FIG. 1 is a functional diagram illustrating a dynamic memory device operable in a nibble mode.
Figure 2:
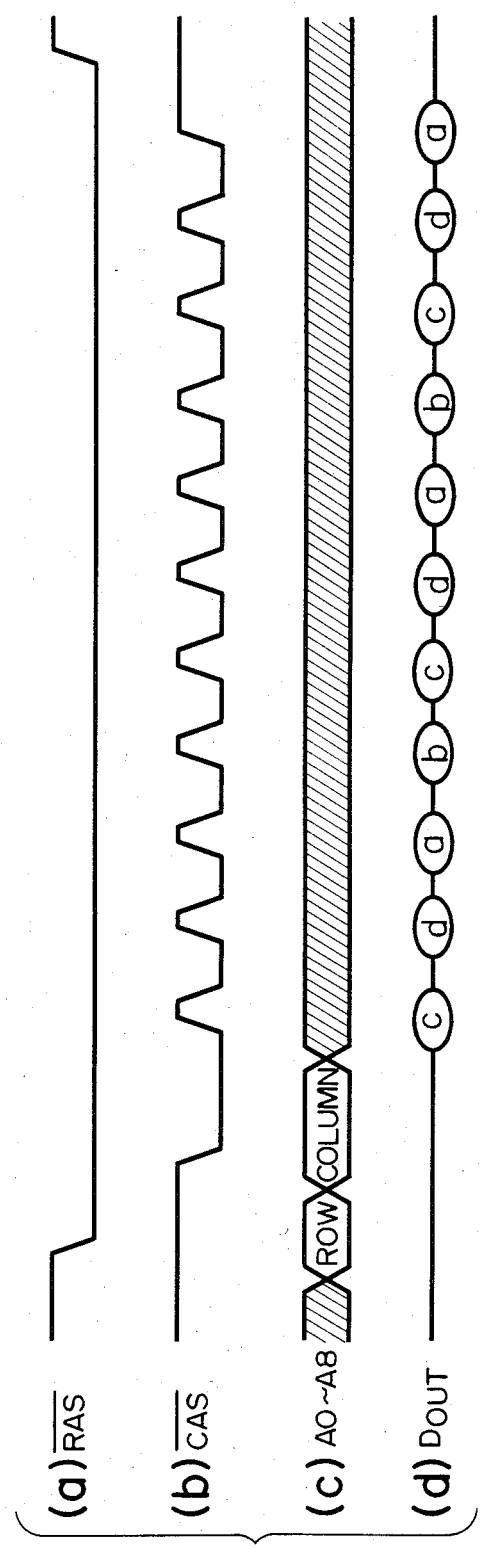
FIGS. 2(a)–(d) shows a timing diagram illustrating the sequence of signals which occur in a read cycle of a nibble mode.
Figure 3:
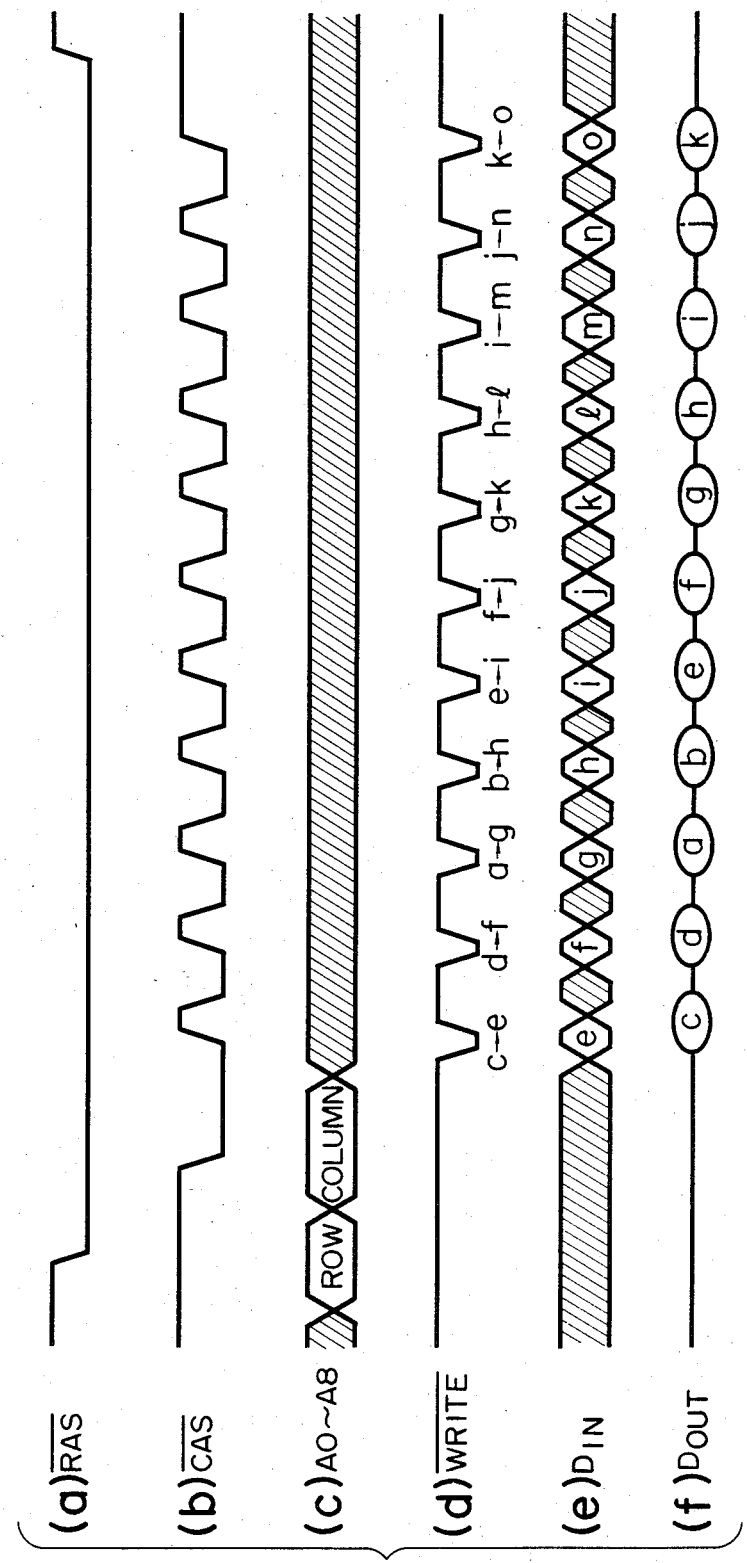
FIGS. 3(a)–(f) is a timing diagram illustrating the sequence of signals which occur in a write cycle of the nibble mode.
Figure 4:
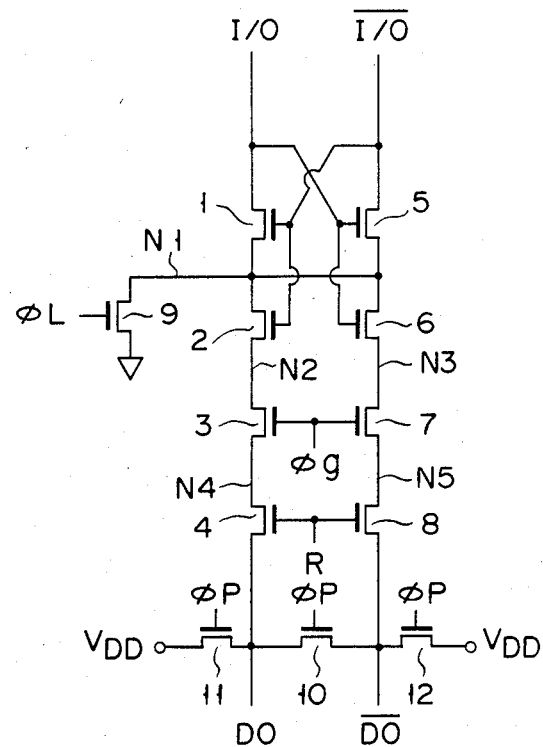
FIG. 4 is a circuit diagram illustrating a one-bit part of a conventional latch circuit.

In the data output section shown in FIG. 9, the node must be charged by the output signal from the high level line of those line pairs DO and $\overline{DO}$. On the other hand, in the conventional latch section, as shown in FIG. 4, one of the paired output lines DO and $\overline{DO}$ is wired to the power source $V_{SS}$, while the other is in a high floating level. Therefore, the output line in the high level operates in an unstable floating level.

For this reason, a latch circuit, as shown in FIG. 12, is desirably used as the latch circuit for applying a signal through the paired output lines DO and $\overline{DO}$ to the data output circuit, as shown in FIG. 9. In FIG. 12, at the time of data is being output, one of the output lines DO and $\overline{DO}$ is connected to the power source $V_{DD}$, while the other is connected to the power source $V_{SS}$, thereby reliably fixing the potentials on the respective output lines.

FIG. 12 shows a circuit diagram illustrating a latch section according to the present invention. As shown, a pair of latch lines I/O and $\overline{I/O}$ are respectively connected through MOSFETs 50–53 and MOSFETs 54–57 to a pair of output lines DO and $\overline{DO}$ of the latch circuit. The gates of the MOSFETs 50 and 51 are connected together and to the latch line $\overline{I/O}$. Similarly, the gates of the MOSFETs 54 and 55 are connected together and to the latch line I/O. A series connection point of the MOSFETs 50 and 51 and a series connection point of the MOSFETs 50 and 55 are continuous to the node N17 further connected to the power source $V_{SS}$ through a MOSFET 58. The gate of the MOSFET 58 is impressed with a clock pulse $\phi_L$. The MOSFETs 51 and 52 are interconnected to provide a node N18. Similarly, the MOSFETs 55 and 56 are interconnected to provide a node N19. A gate clock pulse $\phi g$ is coupled to an interconnection of the gates of the MOSFETs 52 and 56. Interconnections between the MOSFETs 52 and 53 and between the MOSFETs 56 and 57 respectively provide nodes N20 and N21. A second pair of the transistor MOSFETs 53 and 57 are interconnected at the gates. The interconnection of the gates is impressed with a select signal R. Further, a MOSFET 59 is interposed between the output line pair DO and $\overline{DO}$, and further MOSFETs 60 and 61, connected in series, are connected at both ends to the power source $V_{DD}$. A precharge clock pulse $\phi p$ is deposited to the gates of the MOSFETs 59–61.

MOSFETs 62 and 63 are serially placed between the latch line I/O and a node N20. The gates of the MOSFETs 62 and 63 are respectively coupled with the paired latch lines $\overline{I/O}$ and I/O. The MOSFETs 64 and 65 are serially placed between the latch line $\overline{I/O}$ and a node N21. The gates of the MOSFETs 64 and 65 are respectively coupled with the paired latch lines I/O and $\overline{I/O}$. MOSFETs 66 and 67, as first charging transistors, are respectively inserted between the paired latch lines I/O and $\overline{I/O}$ and the power source $V_{DD}$, as shown. Second charge transistors, or MOSFETs 68 and 69, are respectively placed between the nodes N20 and N21 and the power source $V_{DD}$, as shown. A junction point between the MOSFETs 62 and 63 and a junction point between the gates of MOSFETs 66 and 68 are interconnected through a node N22. A clock pulse $\phi$ is capacitively coupled with a node N22, through a capacitor C1. A junction point between the MOSFETs 64 and 65 and a junction point between the gates of MOSFETs 67 and 69 are interconnected through a node N23. The node N23 is applied with a clock pulse $\phi$ through a capacitor C2.

Figure 5:
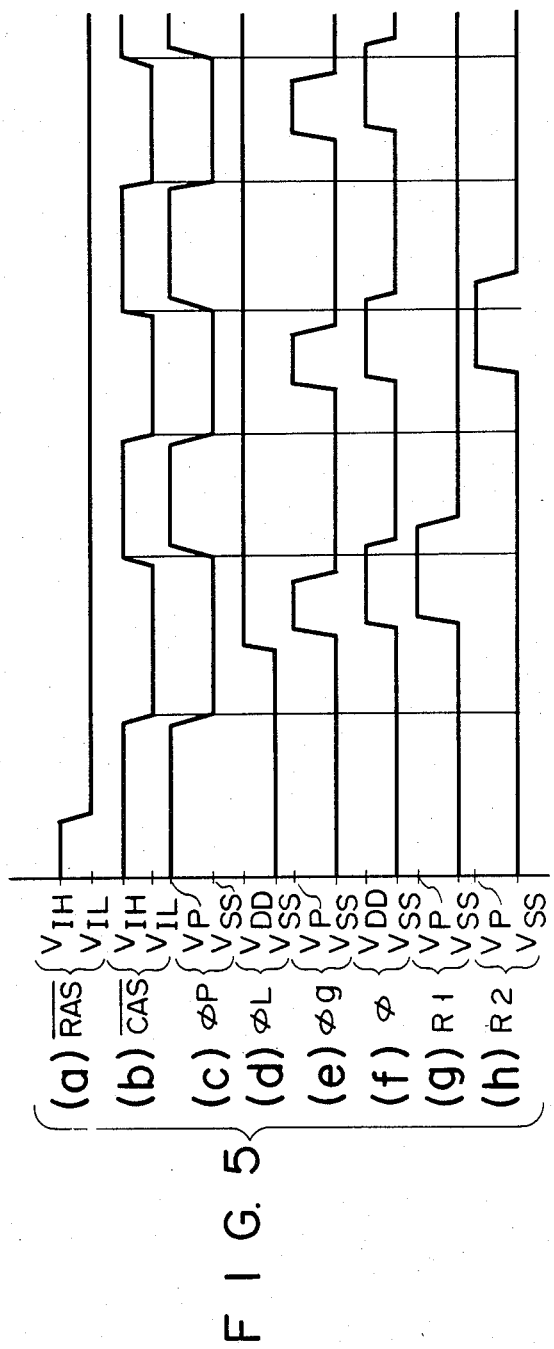
FIGS. 5(a)–(h) is a timing diagram useful in explaining the operation of the latch section shown in FIGS. 4 and 12.
Figure 7:
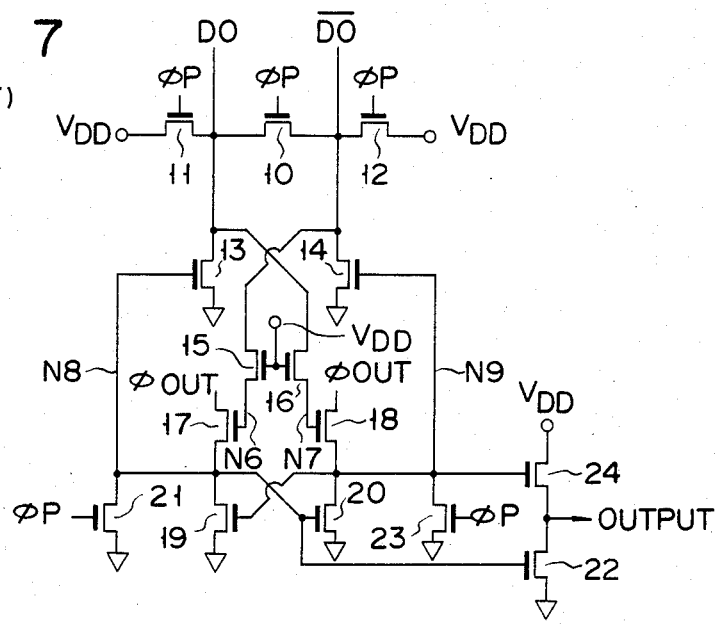
FIG. 7 is a circuit diagram illustrating a conventional data output section.

In the latch section thus arranged, in the precharge period from an instant that the row address strobe signal $\overline{RAS}$ rises until the column address strobe signal $\overline{CAS}$ first falls, as shown in a timing diagram of FIG. 5, the paired I/O line has been charged up to the potential of the power source $V_{DD}$. At this time, the latch line pair I/O and $\overline{I/O}$ are at the potential of the power source $V_{DD}$. Accordingly, the MOSFETs 50, 54, 51, 55, 62, 64, 63, and 65 are turned on to cause the nodes N17–N23 to be at $V_{DD}-V_T$.

When the column address strobe signal $\overline{CAS}$ falls, the precharge clock pulse $\phi p$ falls to the potential of the power source $V_{SS}$. With the clock pulse going negative, the MOSFETs 59–61 are turned off and the output line pair DO and $\overline{DO}$ float. In time, data is output to the latch line pair I/O and $\overline{I/O}$. Let us assume that the data applied to those latch lines causes latch line I/O to be high and the latch line $\overline{I/O}$ to be low. When signal levels are set up on the latch line pair I/O and $\overline{I/O}$ by the data applied, the clock pulse $\phi_L$ goes positive to turn on the MOSFET 58. The node 17 is connected to the potential of the power source $V_{SS}$, and the MOSFETs 50 and 54 form a flip-flop. With the formation of the flip-flop, the potential on the latch line $\overline{I/O}$ is dropped to the level of the $V_{SS}$ power supply through the MOSFET 54. Then, the MOSFETs 50, 51, 62 and 65 are turned off. With the turning off of the MOSFET 50, the latch line I/O retains a high level. With the turning off of the MOSFET 62, the node N22 is isolated from the latch line I/O. As the result of turning off the MOSFET 51, the node N18 is isolated from the node N17, thus keeping its high level.

The $V_{SS}$ power supply potential on the latch line $\overline{I/O}$ causes the nodes N19 and N23 to be placed at the same potential. When the gate clock pulse $\phi g$ rises to Vp, the MOSFETs 52 and 56 are on, and the node N21 is continuous to the node N19 to ensure the potential of the $V_{SS}$ power supply. Then, when the clock pulse $\phi$ rises, the capacitor C1 boosts the level on the node N22. At this time, the gate of the MOSFET 63 is approximately at the potential of the $V_{DD}$ power supply and the node N20 is approximately $V_{DD}-V_T$. Under this condition, the MOSFET 63 operates as a barrier, so that the potential on the node N22 is pulled up to Vp. The Vp on the node N22 turns on the MOSFETs 66 and 68 to connect the latch line I/O to the $V_{DD}$ power supply and to connect the node N20 to the potential of the $V_{DD}$ power supply. Even if the clock pulse $\phi$ goes positive, the node N23 is left low in potential because it is connected to the $V_{SS}$ power supply. When this latch circuit under discussion is selected, the select signal R rises up to Vp and the MOSFETs 53 and 57 are turned on. Further, the output line DO is connected to the node N20, and through the MOSFET 53 to the $V_{DD}$ power supply. Finally, the output line DO is fixed at the potential of the $V_{DD}$ power supply.

The output line $\overline{DO}$ is connected to the potential of the $V_{SS}$ power supply through the MOSFETs 55–57. Subsequently, the gate clock pulse $\phi g$ falls to the potential of the $V_{SS}$ power supply, turning off the MOSFETs 52 and 56. Then, the writing operation is performed to reverse the potentials on the latch lines I/O and $\overline{I/O}$. Accordingly, the latch line I/O is connected to the $V_{SS}$ power supply, and the latch line $\overline{I/O}$ is connected to the $V_{DD}$ power supply. With the connection, logical states in the flip-flop including the MOSFETs 50 and 54 are forcibly inverted. The result is that the MOSFETs 63, 54, 55, and 64 are off, while the MOSFETs 65, 50, 51, and 62 are on. The node N23 is disconnected from the latch line $\overline{I/O}$ and connected to the node N21 since the MOSFET 64 is off and the MOSFET 65 is on. Further, the node N22 is disconnected from the node N20 and connected to the latch line I/O since the MOSFET 62 is on and the MOSFET 63 is off. The result is that the node N22 is at the potential of the $V_{SS}$ power supply, the MOSFETs 66 and 68 are off, and the latch line I/O and the node N20 are disconnected from the $V_{DD}$ power supply.

Then, the column address strobe signal $\overline{CAS}$ goes positive, and the precharge clock pulse $\phi p$ goes positive and reaches Vp. At this time, the MOSFETs 59–61 are turned on, and the output lines DO and $\overline{DO}$ are coupled to the $V_{DD}$ power supply. Subsequently, the clock pulse $\phi$ goes negative, but the select signal R is still at Vp. Therefore, the nodes N20 and N21 are at $V_{DD}$. The node N23 connected to the node N21 is charged up to $V_{DD}-V_T$. The node N22 is connected to the $V_{SS}$ power supply, via the MOSFETs 50, 58 and 62. When the select signal R falls to the $V_{SS}$ potential, the MOSFETs 53 and 57 are turned off and the latch section is disconnected from the output line pair DO and $\overline{DO}$.

After the second fall of the column address strobe signal $\overline{CAS}$, one of the nodes N20 and N21 is connected to the $V_{DD}$ power supply according to the potentials on the nodes N22 and N23. The above operation is performed in the respective latch sections. Accordingly, if the latch selected and the output line pair DO and $\overline{DO}$ are interconnected, one of the output lines DO and $\overline{DO}$ is always connected the $V_{DD}$ power supply, while the other is always connected to the $V_{SS}$ power supply, according to the data held in the latch section.

Figure 13:
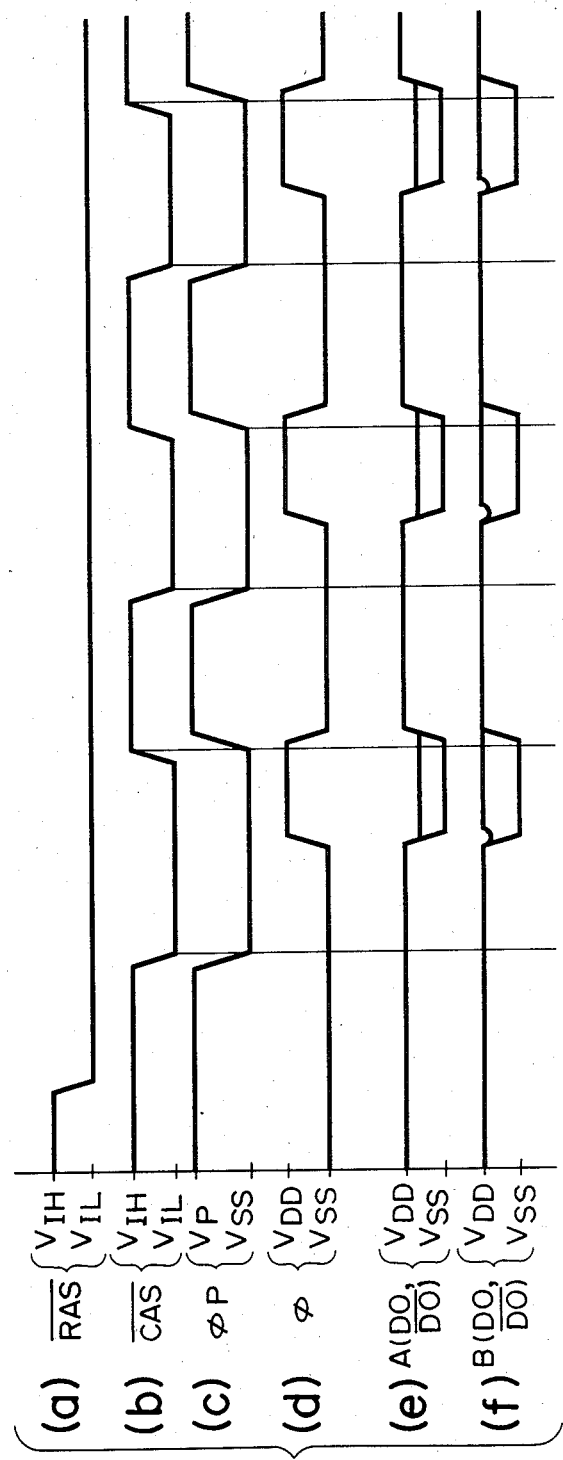
FIGS. 13(a)–(f) is a timing diagram comparatively illustrating the operations of the latch sections of FIGS. 4 and 12.

When the clock pulses $\phi p$ and $\phi$ are produced, as shown in FIG. 13, with the change in the row address strobe signal $\overline{RAS}$ and the column address strobe signal $\overline{CAS}$, A(DO, $\overline{DO}$) illustrates a variation of the signal levels on the output line pair in the prior art. The high level portions indicate a floating state. B(DO, $\overline{DO}$) shows a variation of the signal level on the output line pair in the embodiment of the present invention. As shown, the potential on the output line pair is held at $V_{DD}$ or $V_{SS}$. More specifically, as seen from the waveform A(DO, $\overline{DO}$), when the precharge clock pulse $\phi p$ is at $V_{SS}$, the high level output line drops its potential when the column address strobe signal $\overline{CAS}$ falls and the data output section operates, even if the output lines are charged up to the $V_{DD}$ potentials in the precharge time. The reason for this is that in such a situation, charges on the high level output line are divided because the other node is charged. On the other hand, in the waveform of B(DO, $\overline{DO}$), the high level output line of those DO and $\overline{DO}$ is connected to the $V_D$ power supply at the leading edge of the clock pulse $\phi$, so that its high level can reliably be held. Incidentally, the MOSFETs in the above-mentioned embodiment may of course be replaced by ordinary transistors.

When the data output section of FIG. 9 is combined with the latch section of FIG. 12, the data window can be widened, for example, up to about the minimum cycle $t_{NCmin}$, thereby making the best use of the high speed performance of the nibble mode.

What is claimed is:

1. A data output circuit for a dynamic memory device for producing the contents of memory cells in the memory device, said data output circuit having a data output section comprising:

a pair of data transfer nodes for transferring data read out from a memory cell in the form of a potential change;

a pair of medium nodes respectively coupled with the pair of said data transfer nodes through first switching elements;

a node providing a gate input to a load transistor inserted between a data output node and a power supply;

a node providing a gate input to a drive transistor inserted between said output node and ground;

a first transistor having a gate input of a node on which the potential follows a potential change on one of said medium nodes, said transistor being inserted between said node providing the gate input to said load transistor and a node impressed with an output drive signal $\phi$out;

a second transistor having a gate input of a node on which the potential follows a potential change on the other of said medium nodes, said transistor being inserted between the node providing the gate input to said drive transistor and a node impressed with the ouput drive signal; and second switching elements for placing the pair of said medium nodes at ground potential during a precharge period, and wherein, during a precharge period, said second switching elements are turned on, the pair of said data transfer nodes are precharged, and said node as the gate input to said load transistor and said node as the gate input to said drive transistor are isolated from the output drive signal $\phi$out by turning off said first and second transistors.

2. The data output circuit according to claim 1, in which said data output section is coupled to output data from a latch section comprising:

a flip-flop applied with the data from a memory cell through paired latch lines;

a first pair of transistors coupled with the output of said flip-flop;

a second pair of transistors coupled with the outputs of the first pair of said transistors, and being made conductive by a select signal;

first charge transistors respectively inserted between said pairs latch lines and the power supply;

second charge transistors respectively inserted between nodes lying in the connections of the first and second pairs of said transistors and the power supply; and capacitors for pulling up nodes providing gate inputs to said first and second charge transistors by a capacitance coupling.

3. The data output circuit according to claim 1, in which charges on the pair of said data transfer nodes are shared with the pair of said medium nodes by means for turning on said first switching elements at the start of a data output cycle, thereby to boost potential on said medium nodes, to turn on said transistors respectively having the nodes of the gate inputs on which the potential follows the potential change on said medium nodes, and to connect said node providing the gate input to said load transistor and said node providing the gate input to said drive transistor to an output drive signal at ground potential, thereby to set said nodes at ground potential.

* * * * *

UNITED STATES PATENT AND TRADEMARK OFFICE
CERTIFICATE OF CORRECTION

PATENT NO. : 4,603,403
DATED : July 29, 1986
INVENTOR(S) : TODA, Haruki

It is certified that error appears in the above-identified patent and that said Letters Patent is hereby corrected as shown below:

In the title page of the Letters Patent with respect to the address of the assignee, please replace "Tokyo" with --Kawasaki-Shi--; and Column 12, line 68, replace "pairs" with --paired--.

Signed and Sealed this

Seventh Day of April, 1987

Attest:

DONALD J. QUIGG

Attesting Officer

Commissioner of Patents and Trademarks